(12) United States Patent
Sherrer et al.

(10) Patent No.: US 8,969,132 B2
(45) Date of Patent: Mar. 3, 2015

(54) DEVICE PACKAGE AND METHODS FOR THE FABRICATION THEREOF

(75) Inventors: David William Sherrer, Radford, VA (US); James MacDonald, Chandler, AZ (US)

(73) Assignee: Nuvotronics, LLC, Radford, VA (US)

( * ) Notice: Subject to any disclaimer, the term of this patent is extended or adjusted under 35 U.S.C. 154(b) by 724 days.

(21) Appl. No.: 13/237,931

(22) Filed: Sep. 20, 2011

(65) Prior Publication Data

US 2012/0067871 A1     Mar. 22, 2012

(51) Int. Cl.
*H01L 21/00* (2006.01)
*H01L 23/047* (2006.01)
*C23C 24/08* (2006.01)
*C23C 28/04* (2006.01)
*C23C 28/00* (2006.01)
*H01L 23/06* (2006.01)
*H01L 23/24* (2006.01)
*H01L 23/00* (2006.01)
*H01Q 17/00* (2006.01)
*H01Q 23/00* (2006.01)

(52) U.S. Cl.
CPC ............ *H01L 23/047* (2013.01); *C23C 24/082* (2013.01); *C23C 28/042* (2013.01); *C23C 28/42* (2013.01); *H01L 23/06* (2013.01); *H01L 23/24* (2013.01); *H01L 23/564* (2013.01); *H01Q 17/00* (2013.01); *H01Q 23/00* (2013.01); *H01L 2924/09701* (2013.01); *H01L 2224/48091* (2013.01); *H01L 2224/48227* (2013.01); *H01L 2224/49109* (2013.01)
USPC ........... 438/106; 257/728; 257/787; 257/678; 438/127

(58) Field of Classification Search
USPC ................ 257/664, 678, 704, 728, 729, 787; 438/106, 127
See application file for complete search history.

(56) References Cited

U.S. PATENT DOCUMENTS

| | | | |
|---|---|---|---|
| 4,293,519 A | 10/1981 | Knappenberger |
| 5,276,414 A | 1/1994 | Fujimoto |
| 5,488,015 A | 1/1996 | Havemann |
| 5,838,551 A | 11/1998 | Chan |
| 6,281,574 B1 | 8/2001 | Drake |
| 6,383,660 B2 | 5/2002 | Igarashi |
| 6,423,566 B1 | 7/2002 | Feger |
| 6,713,867 B2 | 3/2004 | Mannak |
| 6,909,176 B1 | 6/2005 | Wang |
| 6,995,470 B2 | 2/2006 | Ahn |
| 7,091,611 B2 | 8/2006 | Ahn |
| 7,262,369 B1 | 8/2007 | English |

(Continued)

OTHER PUBLICATIONS

Chance, G.I. et al., "A suspended-membrane balanced frequency doubler at 200GHz," 29th International Conference on Infrared and Millimeter Waves and Terahertz Electronics, pp. 321-322, Karlsrube, 2004.

(Continued)

*Primary Examiner* — S. V. Clark

(74) *Attorney, Agent, or Firm* — Niels Haun; Dann Dorfman Herrell & Skillman, PC

(57) ABSTRACT

Disclosed and claimed herein is a microwave assembly having a substrate comprising a microwave device; said device having a die, a first layer having a dielectric constant between about 1.00 and about 1.45 and a thickness between about 0.05 and about 2 mm along with one or more layers chosen from an absorbing layer, an EMI blocking layer, a layer comprising conductive material or a metal cover.

27 Claims, 2 Drawing Sheets

(56) References Cited

U.S. PATENT DOCUMENTS

| | | | |
|---|---|---|---|
| 7,585,702 | B1 | 9/2009 | Wang |
| 8,164,815 | B2 | 4/2012 | Londergan |
| 8,517,275 | B2* | 8/2013 | Tsuchiya ............... 235/492 |
| 2003/0013284 | A1* | 1/2003 | Emrick et al. ............ 438/575 |
| 2003/0080442 | A1* | 5/2003 | Unger ................... 257/787 |
| 2004/0149686 | A1 | 8/2004 | Zhang |
| 2012/0067871 | A1 | 3/2012 | Sherrer |
| 2012/0249375 | A1 | 10/2012 | Heino |
| 2012/0299003 | A1* | 11/2012 | Yamazaki et al. ........ 257/59 |

OTHER PUBLICATIONS

Immorlica, Jr., T. et al., "Miniature 3D micro-machined solid state power amplifiers," COMCAS 2008.

Ehsan, N. et al., "Microcoaxial lines for active hybrid-monolithic circuits," 2009 IEEE MTT-S Int. Microwave.Symp. Boston, MA, Jun. 2009.

Filipovic, D. et al., "Monolithic rectangular coaxial lines. Components and systems for commercial and defense applications," Presented at 2008 IASTED Antennas, Radar, and Wave Propagation Conferences, Baltimore, MD, USA, Apr. 2008.

Filipovic, D.S., "Design of microfabricated rectangular coaxial lines and components for mm-wave applications," Microwave Review, vol. 12, No. 2, Nov. 2006, pp. 11-16.

Ingram, D.L. et al., "A 427 mW 20% compact W-band InP HEMT MMIC power amplifier," IEEE RFIC Symp. Digest 1999, pp. 95-98.

Lukic, M. et al., "Surface-micromachined dual Ka-band cavity backed patch antennas," IEEE Trans. AtennasPropag., vol. 55, pp. 2107-2110, Jul. 2007.

Oliver, J.M. et al., "A 3-D micromachined W-band cavity backed patch antenna array with integrated rectacoax transition to wave guide," 2009 Proc. IEEE International Microwave Symposium, Boston, MA 2009.

Rollin, J.M. et al., "A membrane planar diode for 200GHz mixing applications," 29th International Conference on Infrared and Millimeter Waves and Terahertz Electronics, pp. 205-206, Karlsrube, 2004.

Rollin, J.M. et al., "Integrated Schottky diode for a sub-harmonic mixer at millimetre wavelengths," 31st International Conference on Infrared and Millimeter Waves and Terahertz Electronics, Paris, 2006.

Saito et al., "Analysis and design of monolithic rectangular coaxial lines for minimum coupling," IEEE Trans. Microwave Theory Tech., vol. 55, pp. 2521-2530, Dec. 2007.

Vanhille, K. et al., "Balanced low-loss Ka-band µ-coaxial hybrids," IEEE MTT-S Dig., Honolulu, Hawaii, Jun. 2007.

Vanhille, K. et al., "Ka-Band surface mount directional coupler fabricated using micro-rectangular coaxial transmission lines," 2008 Proc. IEEE International Microwave Symposium, 2008.

Vanhille, K.J. et al., "Ka-band miniaturized quasi-planar high-Q resonators," IEEE Trans. Microwave Theory Tech., vol. 55, No. 6, pp. 1272-1279, Jun. 2007.

Vyas R. et al., "Liquid Crystal Polymer (LCP): The ultimate solution for low-cost RF flexible electronics and antennas," Antennas and Propagation Society, International Symposium, p. 1729-1732 (2007).

Wang, H. et al., "Design of a low integrated sub-harmonic mixer at 183GHz using European Schottky diode technology," From Proceedings of the 4th ESA workshop on Millimetre-Wave Technology and Applications, pp. 249-252, Espoo, Finland, Feb. 2006.

Wang, H. et al., "Power-amplifier modules covering 70-113 GHz using MMICs," IEEE Trans Microwave Theory and Tech., vol. 39, pp. 9-16, Jan. 2001.

Vanhille, K., "Design and Characterization of Microfabricated Three-Dimensional Millimeter-Wave Components," Dissertation, 2007.

Ehsan, N., "Broadband Microwave Litographic 3D Components," Dissertation 2009.

Colantonio, P., et al., "High Efficiency RF and Microwave Solid State Power Amplifiers," pp. 380-395, 2009.

Maex et al, "Low dielectric constant materials for microelectronics," Journal of Applied Physics 93, 8793 (2003).

Thomas, Havemann, "Overview of Interconnect," Handbook of Semiconductor Manufacturing Technology, Chapter 10, pp. 287-309 (2000).

* cited by examiner

DEVICE PACKAGE AND METHODS FOR THE FABRICATION THEREOF

The subject matter of the present application was made with Government support from the Naval Surface Warfare Center under contract number N65538-10-M-0114. The Government may have rights to the subject matter of the present application.

REFERENCE TO PRIOR FILED APPLICATIONS

This application claims the benefit of U.S. Provisional Application No. 61/384,374 filed Sep. 20, 2010, U.S. Provisional Application No. 61/421,854 filed Dec. 12, 2010, and U.S. Provisional Application No. 61/521,742 filed Aug. 9, 2011 under 35 U.S.C. §119(e); which applications are incorporated by reference herein in their entirety.

FIELD OF THE INVENTION

The present invention relates generally to device packages, and in particular to non-hermetic packages for microwave devices and assemblies. Disclosed herein are protected microwave device assemblies having a layer or layers; at least one of which has a low dielectric constant.

BACKGROUND

Many high end microwave assemblies are still hermetically packaged, such as transmit and receive modules for phased arrays, components for defense applications, power amplifiers, assemblies requiring chip and wire construction, high performance devices and circuit operating in the upper microwave and mm-wave bands, and so on. The reasons include ensuring reliability under environmental variations and a lack of organic or polymer protective layers that do not reduce or interfere with device performance due to factors such as dielectric loss or attenuation, or due to changing the electrical impedance of transmission lines contained in or on the device. Hermetic packaging has substantial drawbacks. The substantial cost and yield impact may be attributed to the specialized nature of the parts used in hermetic packaging, such as metal or ceramic housings, solderable or weldable lids, hermetic seals such as glass-metal seals for connectors, and the manual labor usually required for assembly and test and rework. Meanwhile, most consumer electronics traditionally operating at lower frequencies have been able to move to lower cost non-hermetic packaging through the use of protective coatings, underfill polymers, encapsulants and the like. Such approaches enable more automated batch production on large area circuit boards. Non-hermetic cavity packaging has been done in some cases; however, in environments where there is high humidity and fluctuating temperatures, condensation of water can occur inside the package. In addition, ionic contaminates such as sodium, potassium, and calcium can come from environmental sources including fingerprints, the air or salt water can penetrate many non-filled cavity structures and produce electrical reliability problems such as conductivity between circuits and/or corrosion. The problems from such condensation and ionic contaminates can be eliminated by employing polymer or silicone encapsulations over the electronics components.

Traditional approaches used to package devices for consumer electronics do not work well on microwave devices and the circuit boards on which they are mounted because of the field interaction from the transmission lines in the circuits extend into the surrounding mediums and often extend into the encapsulants or coatings producing problems such as attenuation, changing transmission line impedance, and otherwise interfering with the function of the circuit. For example, a microstrip transmission line with a coupled-line filter can have substantial field lines that interact on or around the signal line upper surfaces. The same is also true of a coplanar waveguide (CPW) transmission line. Traditional materials such as those based on silicones, acrylates, and even high performance vapor deposited coatings such as parylene have substantially higher than air dielectric constants changing the transmission line impedance or function. Moreover, the loss tangents of these materials can substantially alter circuit performance in ways that cause it to deviate from design targets, particularly at high microwave frequencies. While such materials can be valuable in non-hermetic packaging, their use in microwave devices and modules without some means of separating them from the microwave devices will usually result in detrimental interactions. To address these problems, some microwave devices such as monolithic microwave integrated circuits (MMICs) and circuit boards have been designed with buried transmission lines to minimize field interactions with the surrounding environment, specifically with, for example, underfill materials or encapsulants. While this addresses the problem of the surrounding environment substantially changing their function, it does not enable optimal performance as the losses in many semiconductors and circuit board materials are high and typically increase with frequency. As frequency moves up from 2 to 10 to 40 GHz or above the problem of losses in packaging materials becomes increasingly demanding. Accordingly, there remains a need to have a low cost non-hermetic packaging technology for devices containing microwave circuitry with transmission lines for example such as microstrip or CPW or any primarily air-dielectric or suspended transmission lines, including waveguides and air-dielectric coaxial transmission lines, that allows RF, microwave, and mm-wave components, devices, and assemblies containing such transmission lines to operate with minimal interaction with the dielectrics surrounding them while protecting them from the environment.

A possible solution to this problem, as further disclosed herein, is the use of a very low-k layer of material, such as a foam, that does not substantially interfere with the operation of a circuit designed for operation in air or in a vacuum environment. Such a layer can be applied thick enough to minimize field interactions, for example 0.5 to 2 mm or more thick, and can be used as a "spacer layer" to an outer protective set of layers. Exceptionally low-k materials, such as expanded urethane foams, sol-gels, aerogels, porogen filled polymers, and syntactic foams with low dielectric constants, for example, below approximately two, can serve as a spacer layer without adversely affecting all but the most sensitive devices (such as, for example, high Q or narrow band pass filters). Unfortunately, such low-k foams as currently exist are usually also porous and permeable to moisture and ionic contaminant penetration. A solution to this is to seal the low-k material using one or more sealing layers. U.S. Pat. No. 6,713,867 B2 to Mannak et al. discloses a syntactic foam protected by a "moisture proof top layer" identified as a "polymer lacquer". U.S. Pat. No. 6,713,867 B2 does not, however, identify any candidate materials to satisfy this requirement and does not identify the need for an ionic barrier or more than one sealing layer. It also does not identify the importance of choosing low ionic contaminate materials or materials based their ability to resist contaminants such as sodium, potassium, and other ionic conductors with high mobility. There are many polymer lacquers that would not work well and many polymer lacquers that would allow moisture to penetrate. For example, RTV silicone contains ionic contaminants. Polyacrylic acid, polyvinyl alcohol, polyvinyl pyrolidone, phenolic resins such as novalaks or anything with a hydroxy group would be poor choices due to their ionic mobility.

In addition, the reference does not identify various improvements to the art to enable its practical use. Such improvements include, for example, the use of adhesion layers between the silver paints and ionic barriers such as, for example, electronic grade silicones; the need to protect conductive paint, for example silver-filled conductive paints which can be used for EMI shielding, from corrosion; the use of EMI absorbing layers such as, for example, graphite filled silicones; or the use of secondary protection layers such as ALD coatings on circuits. Thus, despite the fact that syntactic foams have been available since the 1960's and other low-k materials, such as aerogels, have been available to the packaging industry for over a decade, these materials have still not found use for microwave device packaging with the exception of spacer layers in antenna construction.[i] Thus, many high performance microwave devices for critical applications in airborne and marine environments, such as T/R modules, radar modules, chip and wire assemblies, still require expensive hermetic packages.

U.S. Pat. No. 6,423,566 B1 to Feger et al. discloses a method to protect the interconnect layers of a semiconductor chip or wafer where the electrical interconnect layers of the device are contained in the dielectric, said dielectric including materials that include a low-k dielectric. Disclosed are a number of possible thin polymeric barriers that can be applied to the wafer or chip after manufacturing it to protect the exposed portions of dielectric materials in the interconnect layers from ionic contamination and moisture ingress. While U.S. Pat. No. 6,423,566 B1 discloses a polymeric barrier to protect a dielectric disposed on an interconnect structure that may include a low-k material, it does not teach a packaging method or technology or structure for circuits or assemblies or the use or addition of low-k materials applied to a device at a thickness, for example typically 500 to 700 microns, sufficient to prevent deleterious field interactions at a distance from the device's RF or microwave transmission lines to prevent subsequent layers from interfering with the device performance. In the reference, the low-k material was formed as part of an electrical interconnect structure that totals on the order of 5-15 microns in thickness and is instead formed as part of the integrated circuit manufacturing process and is therefore not applied as a component of a device packaging technology. Furthermore, it does not teach the application to microwave devices or microwave device packaging. It does not teach the use of multiple layers for EMI blocking or attenuation. In addition, the ionic and moisture barrier layers taught in the reference are less than one micron thick whereas the ionic and moisture barrier layers required for RF packaging are typically on the order of 100-500 times thicker. Finally, while a RF or microwave device is not taught, if the semiconductor device in U.S. Pat. No. 6,423,566 B1 was, in fact, a microwave device and it was being packaged on a circuit board, it would still require the solution for non-hermetic packaging taught herein, i.e., providing thick low-k layer, ionic sealing layers and EMI blocking layers or absorbing layers as no provisions are made to solve EMI coming from the device itself or from a circuit to which it is attached.

DETAILED DESCRIPTION OF THE DRAWINGS

Figure 1:
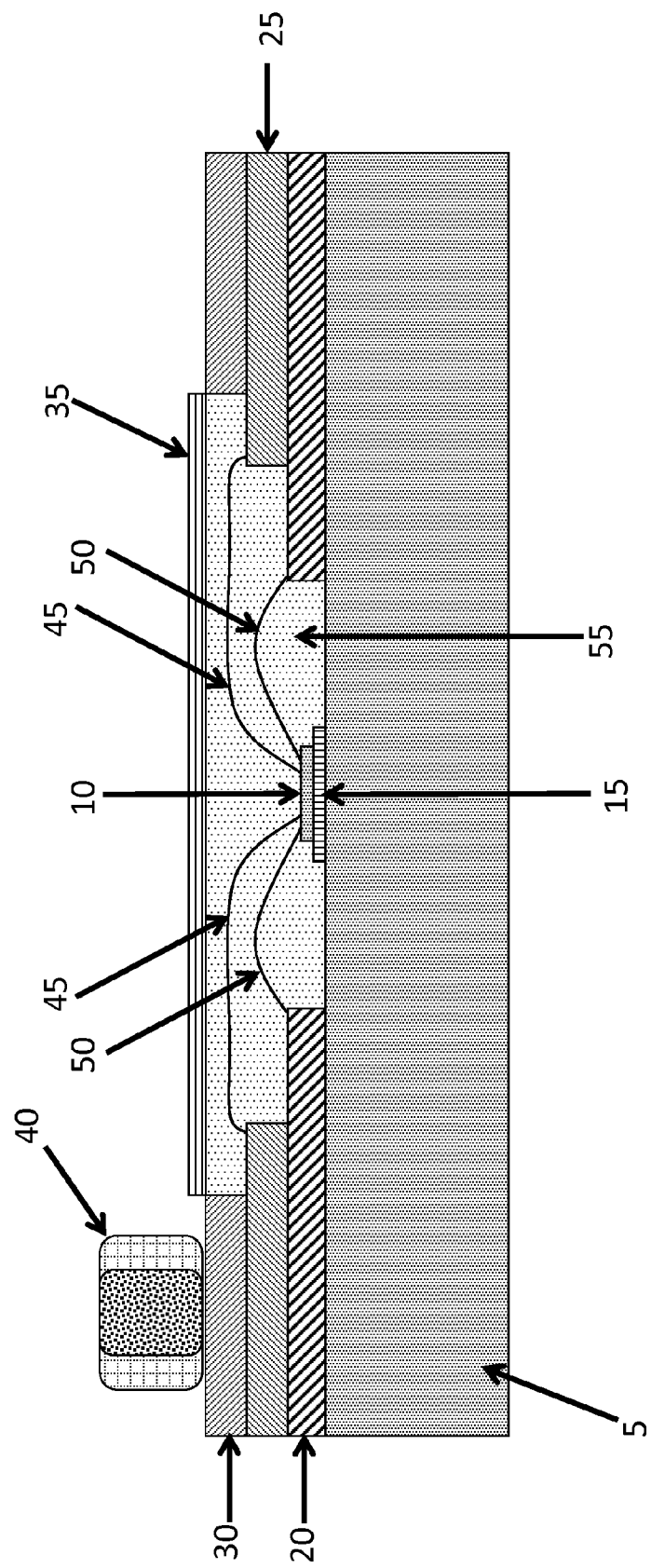
FIG. 1 illustrates a cross section of a microwave assembly, wherein a microwave device is mounted on a circuit board, in accordance with an embodiment disclosed and claimed herein.

In accordance with one aspect of the invention, FIG. 1 shows a cross section of an example microwave circuit assembly of a chip-in-board construction using a low-k material, wherein an active microwave device, 10, is thermally coupled to a heat spreader or CTE matching layer, 15. For small devices and in certain constructions 15, may be omitted. In this embodiment, the heat spreader and devices are mounted on a circuit board or substrate, 5. 5 may be, for example, a multi-layer circuit board, a Au/Ni plated copper substrate, a brass or Aluminum substrate, a ceramic such as Alumina or glass, a semiconductor or all or part of a wafer, or LTCC or HTCC. The thickness of 5 may typically be on the order of 0.1 mm to several mm. Also shown in this embodiment, in schematic form, are various functional layers of the microwave assembly, including layers designed to carry radio frequency (RF) signals, 20, layers designed to carry direct current (DC), 25, for example to power the active devices and other layers such as insulating layers and/or a laminated frame to surround the microwave device(s), 30. The active microwave device may be connected to the RF layer by one or more wirebonds, 50, wherein a plurality of the wires, 50, may carry the same or different signals, and to the DC layer by wires 45, wherein a plurality of wires, 45, may carry the same or different voltages. While wirebonds are shown, the device may alternatively be mounted in the recess in a flip-chip configuration onto layer 20 or 25 and the functions of 20 or 25 may be combined into one layer. In this embodiment, the active microwave device is shown covered by a layer of a dielectric layer having a low dielectric constant, 55. Such material, in the case of a syntactic foam, may be vibrationally compacted and, in the case of a fluid precursor, may be dispensed into the recess. Disposed atop the dielectric layer having a low dielectric constant may be several layers represented by 35, each of which may comprise one or more layers chosen from an electromagnetic interference (EMI) absorbing, an EMI blocking layer being electrically conductive, such as a conductive coating or metal cover, 1, one or more of an adhesive layer between layers to promote adhesion, and a thin secondary barrier such as a ALD dielectric layer. In addition, 35 will contain a sealing layer that operates as an ionic barrier layer and both the ionic barrier and the low-k material, 55, will themselves have low levels of ionic contamination. Also shown in this embodiment is a representation of surface mount components, 40, which may be resistors, capacitors, surface mount active devices, integrated circuits and/or the like. Such support devices may also be located in the low-k recess with the device, 10. Not shown are connectors, wirebondable interfaces, BGA mounting regions, and other I/O that may be present on the assembly to interconnect the assembly to a higher level circuit.

Figure 2:
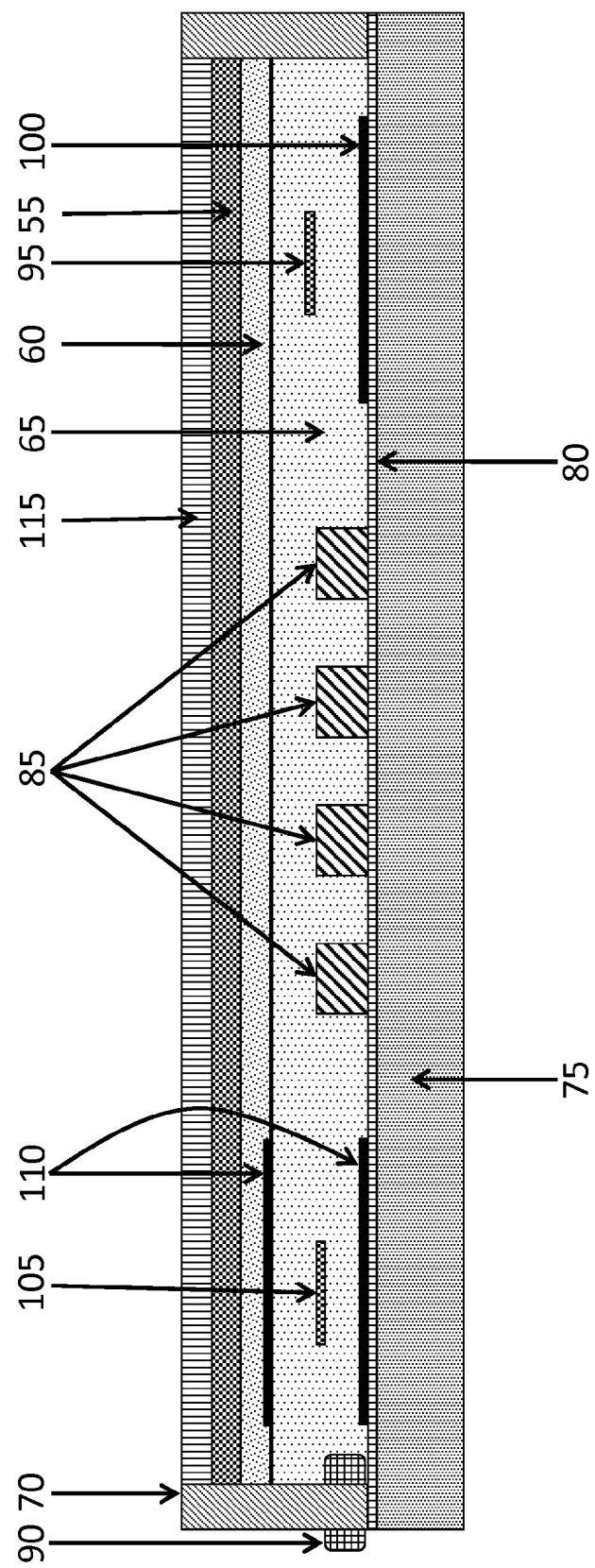
FIG. 2 illustrates a cross section of a microwave assembly, in accordance with an embodiment disclosed and claimed herein.

In accordance with another aspect of the invention, FIG. 2 shows a cross section of a microwave assembly, which includes a circuit board or substrate as described in FIG. 1, 75, optionally coated with a dielectric layer or multiple dielectric layers by atomic layer deposition (ALD) or other suitable coating method, 80. ALD may optionally be used in the example of FIG. 1. The ALD layer may serve as a secondary barrier layer to protect against corrosion and ionic contamination and/or moisture penetration in the event of permeation of the low-k and other coating layers and specifically to protect the devices from a local failure of the primary barrier such as a pinhole or a delamination. An example of such an ALD layer would be 20 alternating layers of zirconia and silica of 2 to 20 nm thickness applied by vapor depostion. Further illustrated in FIG. 2 are components mounted on the board, 85, a material having a low dielectric constant 65, an optional RF absorbing layer, 60, an optional conductive layer 55, and an optional ionic barrier encapsulant, 115. The circuit board may further have a metal or metallized plastic over mold, 70, around the edges or sides or around the top surface of the board and over any edge coaxial or DC connectors, 90 or around any edge connectors or interconnect structure formed of the boards metallization. Such overmolding or laminated frame can be used to create a tub structure or structures to contain one or more of the coating materials and provide containment for its dispensing. Further, the circuit board may have other passive microwave components such as microstrip electrodes, 95, disposed over a ground plane, 100, or stripline electrodes, 105, isolated between two ground planes, 110. Optional layers not shown are phenolic adhesion layers on either side of the conductive EMI blocking layer, 55, which may improve adhesion and corrosion resistance, for example when a silver-filled paint is used. Other optional layers not shown are an additional ionic sealing layer, for example an electronics grade silicone applied directly to the low-k layer, 65. The use of such layer being dependent on the materials chosen for the low-k material and EMI blocking layer.

DETAILED DESCRIPTION

As used herein, the conjunction "and" is intended to be inclusive and the conjunction "or" is not intended to be exclusive unless otherwise indicated. For example, the phrase "or, alternatively" is intended to be exclusive.

As used herein, the term "dielectric" refers to an electrically insulating material having an electrical conductivity less than about $10^{-10}$ Siemens per meter. Further characterizing a dielectric is the dielectric constant, defined by the permittivity of the substance divided by the permittivity of free space.

As used herein, when referring to a coating "on" a specific layer, it includes a coating directly onto the specified layer and may include one or more additional layers between the coating and the specified layer.

As used herein, when referring to microwave devices and microwave frequencies, we intend for the term "microwave" to be used in its broadest sense to include all devices and frequencies from RF to sub-millimeter wave.

Disclosed and claimed herein is a method for non-hermetically protecting a device or assembly containing a microwave transmission line structure. The protected apparatus may include a substrate with a microwave device or transmission line and/or may include a die. The non-hermetic protection is created by forming a low-k dielectric layer, having a dielectric constant between 1.01 and 2 and preferably between 1.2 and 1.6, over the device or assembly and subsequently forming one or more ionic barrier layers over the dielectric layer. The dielectric layer is applied to a thickness of between about 0.05 mm and about 5 mm. The thickness will be based on the distance from the transmission lines that the fields produce interactions and such that the low-k layer is thick enough to contain said fields to an extent that any subsequent layer does not substantially degrade the performance of the device or assembly. The ionic barrier layer, for example electronics grade silicone, is disposed on the surface of the low-k material and is of a thickness from 0.025 mm to several mm and sufficiently thick to ensure there are no holes in the material. The ionic barrier layer(s) function to substantially prevent the penetration of water vapor such that the permeation does not interfere with the operation of the device or assembly within its operating parameters over its operating lifetime and to substantially slow the ingress of ions such as sodium, potassium and the like. Optional layers which can provide additional protection and serve other functions depending on the device or assembly being protected include: one or more EMI blocking layers, one or more EMI absorbing layers, and/or one or more layers of a thin dielectric applied on the device or assembly by aerosol, atomic layer deposition, ionic self-assembly monolayer or another thin film deposition process. The coating of this secondary thin dielectric layer must be relatively conformal and be applied in a sufficiently thin layer to not impact the device operation in a deleterious manner. Functions of layers may be combined. For example, the ionic barrier layer(s) may also have properties that allow it to block or absorb EMI, as may be the case for conductive or resistive particles in a silicone binder.

Further disclosed and claimed herein is a non-hermetic package for protecting a device or assembly containing a microwave transmission line structure constructed with the method outlined above.

Further disclosed to the above methods and structures are adhesion promoting layers or barrier layers which may be used between layers if the layers themselves do not adhere well or may be reactive between them. For example, silver containing conductive paints serving as EMI blocking layers may not adhere well to silicone layers serving as moisture and ionic blocking layers. An adhesion promoting layer such as a phenolic resin may be applied between the layers. All layers in this case may be applied for example by brushing, spraying, and/or casting.

As will become evident, various modifications and enhancements of the above embodiments are within the scope of the subject matter disclosed and claimed herein.

In accordance with the above, microwave devices can be active or passive. Active microwave devices are designed to operate at frequencies between about 300 MHz and about 300 GHz or more and include, without limitation, monolithic microwave integrated circuits (MMICs) and devices comprising discrete transistors or diodes. Such devices may be formed in silicon or other semiconductor materials such as Gallium Arsenide, Germanium, Silicon/Germanium, Indium Phosphide, Gallium Nitride or other semiconductor materials. Functionally, active microwave devices include, without limitation amplifers, transistors, equalizers, integrated circuits, rectifiers, and similar. Passive microwave devices include, without limitation, isolated electrodes such as microstrip waveguides, coplanar waveguides, as well as hollow waveguides, resonators, filters, delay lines but do not comprise layers between antennas. Moreover, the microwave assembly may contain non microwave components for power conditioning, interfacing and the like. In addition, microwave components can be made with normal metals or with superconductors. While normal metal technology is more mature, superconductive components often exhibit advantages in size, speed, and signal fidelity.

Materials having low dielectric constants of between 1 and about 2.0, referred to generally herein as "low-k materials" include aerogels, syntactic foams, expanded foams, materials formed from the decomposition of porogens and the like. The dielectric constant of a porous low-k material depends on the degree of porosity. Generally, the more porous the material, the lower the dielectric constant. However, other factors may affect the dielectric constant such as the presence of solvent impurities, moisture, and ionic materials such as salts, acids and bases and the nonuniformity of the porous low-k material. Accordingly, in one example, dielectric constants may be between 1 and about 1.7. In another example, dielectric constants may be between 1 and about 1.5. In still another example the dielectric constant of a given porous low-k material may be between 1 and about 1.46.

Aerogels describe a class of material based upon a low density, open cell structure with large surface areas (often 900 $m^2/g$ or higher) and nanometer scale pore sizes of about 5 nm to about 50 nm. A variety of different aerogel compositions are known. These may be inorganic, organic and inorganic/organic hybrids (see N. Hüsing and U Schubert, Angew. Chem. Int. Ed. 1998, 37, 22-45). Inorganic aerogels are generally based upon metal alkoxides and include materials such as silica, carbides, and alumina. Organic aerogels include, but are not limited to, urethane aerogels, resorcinol formaldehyde aerogels, and polyimide aerogels. Organic/inorganic hybrid aerogel were mainly organically modified silicate (organically modified silica or "ormosil"). In these materials, the organic and inorganic phases are chemically bonded to each other. Methods of making silica aerogels having low dielectric constants are described infra.

Silica aerogels are formed from sols. Silica ($SiO_2$) sol may be prepared by a two-step process involving acid and base catalysts with tetraethoxysilane (TEOS) as a precursor and isopropyl alcohol (IPA) as a solvent with the sol composition of; $TEOS:H_2O:NH_4OH:HCl:IPA=1.0:4.0:8.2\times10^{-3}:1.8\times10^{-4}:3.0$ in molar ratio. This sol is spin-deposited on the desired substrate using a commercial photoresist spinner in the optimized viscosity range at a spin rate of 2000 to 7000 rpm, depending on the desired thickness. Spin deposition is conducted under an atmosphere saturated with IPA to minimize solvent evaporation from the $SiO_2$ gel. The substrate with the spun-on film is then immersed in IPA and placed in an autoclave at 450° C. and annealed under vacuum for 2 hours.

Other methods of making aerogels are known in the art. For example, in U.S. Pat. No. 6,380,105, Smith et al. describe the following method: In a 500 ml flask are combined, 61.0 ml (0.275 mol) tetraethoxysilane (TEOS), 61.0 ml (0.835 mol) glycerol, 4.87 ml (0.27 mol) water, and 0.2 ml ($2.04\times10^{-4}$ mol) of 1 M $HNO_3$. The mixture is then refluxed for 1.5 hours at 60° C. to form a stock solution. After cooling, the solution may be diluted with ethanol to reduce its viscosity. One suitable stock solution:solvent volume ratio is 1:8. However, this ratio will depend upon desired film thickness, spin speed, and substrate. This is mixed vigorously and typically stored in a refrigerator at 7° C. to maintain stability until use. The solution is warmed to room temperature prior to film deposition.

To produce a film, 3-5 ml of the above precursor sol are dispensed at room temperature onto the substrate, which is then spun between 1500 and 7000 rpm (depending on desired film thickness) for about 5-10 seconds to form sol thin film. During and after this deposition and spinning, the ethanol (from the decomposition of TEOS), water, and the nitric acid are evaporating from film, but due to glycerol's low volatility, no substantial evaporation of the glycerol occurs. This evaporation also shrinks thin film and concentrates the silica content of the sol, forming a film of reduced thickness film shows a reduced thickness sol film obtained after substantially all (about 95% or more) of the ethanol has been removed.

The ratio of silica to fluid can be derived approximately from the TEOS to glycerol ratio in the as-deposited sol (with minor changes due to remaining water, continued reactions and incidental evaporation). As this method largely prevents the gel from permanently collapsing, this ratio determines the density of the aerogel film that will be produced from the sol thin film. Aging is accomplished by allowing the substrate and gel to sit for approximately 24 hours at about 25° C. or by heating it to 130-150° C. for about 1 minute in a closed container.

To form a film of lower dielectric constant, the aged film may be dried without substantial densification by using solvent exchange to replace the aging fluid (glycerin) with a drying fluid and then air drying the film. The first step replaces the aging fluid with an intermediate by dispensing approximately 3-8 mL of ethanol at room temperature onto aged thin film and spinning the wafer between approximately 50 and 500 rpm for about 5-10 seconds. This step is repeated several times as required to eliminate the aging fluid. The second step replaces ethanol with a drying fluid such as heptane. This step comprises dispensing approximately 3-8 mL of heptane at room temperature onto aged thin film. The wafer is spun at approximately 50 to 500 rpm for about 5 to about 10 seconds. This step is repeated several times as required to eliminate the ethanol. The heptane is allowed to evaporate from the wet gel, forming a dry nanoporous dielectric. Alternatively, the wet gel can be dried directly from ethanol. After room temperature drying to remove most of the ethanol (or heptane), the film is baked in a convection oven at 300° C. for 15 to 60 minutes to remove any residual materials. The theoretical dielectric constant (before surface modification) of this embodiment is estimated to be about 1.3.

Syntactic foams are composite sparse materials synthesized by filling a metal, polymer or ceramic matrix with hollow particles called microballoons. The presence of hollow particles results in low density and a low dielectric constant. These materials can be tailored to a given application by selecting from almost any metal, polymer or ceramic. A wide variety of microballoons are known, including cenospheres, glass microspheres, and carbon and polymer microballoons. The most widely used and studied foams are glass microballoon-epoxy, glass microballoon-phenolic, glass microballoon-polystyrene, glass microballoon-polyurethane glass microballoon-polysilsesquioxane and the like. Glass microballoons can be formulated into solutions of virtually any polymer binder material. Glass microballoons suitable for this purpose include ECCOSPHERES® available from Trelleborg Offshore Boston, Inc.

Expanded foams can comprise various polymers, including, without limitation, polystyrene, polyethylene, polyurethane, polypropylene polysilsesquioxane and the like. Several formulations capable of producing cured expanded foams are commercially available, for example TAP X-30®, available from Tap Plastics incorporated.

Matrix materials such as organic and silicon containing polymers such as silsesquioxanes may have their dielectric constants lowered by using porogens. Usually, porogens are nanometer-sized polymer materials, formed as particles, that decompose upon heating, leaving a pore in the matrix material. Commercially available porogen containing materials have dielectric constants of 3 or less. However, one commercially available material is LKD-6103®, available from JSR-Micro Inc., with a dielectric constant of about 1.91.

Ionic barriers may be comprised for example of one or more of an electronics grade silicone, a parylene, a polyimide, and/or a curable BCB resin. The low-k layers may be comprised of one or more of a syntactic foam, an expanded foam, and aerogel, and/or a highly porous material formed from a composite material and optically containing or comprising a porogen.

EMI blocking layers are differentiated from EMI absorbing layers in the blocking layers having a conductive property where as the absorbing layers have a attenuating property through a thickness and do not substantially produce a reflection at their surface in comparison to a blocking layer. EMI blocking layers may be a metal lid or cover, a metallized plastic lid or cover, a conductive paint, a sputtered or evaporated coating, or a conductive coating deposited from a liquid such as a electroless metal coating. Such conductive coatings or paints may contain one or more of silver, gold, copper, palladium or platinum or may be comprised of a conductive polymer or plastic material. EMI attenuating layers serve as absorbers to prevent resonances and reflections inside the cavity formed by the low-k layer and may be comprised of one or more of a resistive film, a resistive coating, a ferrite and/or carbon filled silicone, an iron containing compound, a carbon nanotube composite, or any electric field and/or magnetic field attenuating material which may be cohesively held in a binder or support matrix as a silicone, urethane, or epoxy.

Other layers may be applied on or over the low-k material. For example, a metal lid or metallized plastic cover or case may be used to cover portions of the circuit. Further, a metallic or conductive coating, such as a silver filled paint can be used to introduce electromagnetic interference (EMI) shielding to the circuit. In some cases, such a metal lid or coating may produce a resonant cavity when combined with the low-k coating. Further, a microwave absorbing layer may be used either in conjunction with the EMI shield between it and the low-k layer to reduce resonance or in place of the EMI shield in circumstances where interference with the outside environment or adjacent circuits is negligible. This absorbing layer may be a resistive film or coating such as a resistive metal layer, a composite material such as a carbon filled foam or carbon filled polymer. For example, a carbon or ferrite-filled silicone disposed over the low-k layer may serve as an absorber to suppress cavity modes in the low-k cavity region. It may be comprised of a magnetic material or ferrite or ferrite powder. It may be comprised of a combination of electrically and magnetically lossy materials at the frequencies that need to be attenuated in the circuit. The absorber coating may be used in conjunction with a conductive or resistive coating or metal case to further suppress EMI. Other microwave absorbing materials may be formulated with a binder polymer or foam material, such ground ferrites absorbing ceramics or other resistive materials. Such materials may be integrated into a silicone to provide a ionic barrier. Suppressing EMI may further be accomplished by mechanical design of the encapsulant, for example, by selecting a geometry that eliminates or modifies resonant effects to ensure they occur at frequencies that do not interfere with circuit operation. For example, forming, imprinting, molding, or stamping a pattern into the low-k material, the absorber material or the conductive or resistive coating may be used to diminish resonance in a given interfering frequency range or change the resonant frequency so that it is outside the interfering frequency range. As a particular example, stamping a series of pyramids into the surface of the low-k material, and then applying the absorber material may be used to reduce the Q-factor, or reciprocal of the loss tangent, characteristic of the interfering frequency, or move it out of band. Yet another design approach is to partition a particular area containing multiple circuits into a series of smaller areas, or vice versa, to avoid interfering frequencies or move resonances out of the bands of interest.

Protection layers for the low-k materials and for the microwave devices may be used to improve the robustness of the overall package. Atomic layer deposition can be used to deposit materials or nano-layer composites such as $TiO_2$, $Al_2O_3$, $SiO_2$, $ZrO_2$ and combinations thereof or other materials may be used to protect active and passive microwave devices from moisture or other chemical attack. These coatings may be used in the approach disclosed herein. Such coatings may be applied to sensitive components before mounting or may be applied to the circuits after assembly. However, these coatings alone may be relatively thin or may not substantially prevent the field interaction issues presented supra. Condensation of moisture or contaminants on an active or passive microwave device, for example, can reduce the desired circuit performance in a non-hermetic package. Thus such protection layers are complementary to other approaches described herein. The low-k material can also be protected with overcoatings such as the absorber, conducting layers, or by sealing the low-k material in vapor deposited materials such as a paralene vapor deposited layer.

Before application of the coatings, a cleaning process can be used to create a clean ionic free environment beneath the ionic barrier layer disposed over the low-k material ensuring the low-k filled cavity produced under the barrier layer is free of contaminants. This cleaning process typically will involve a rinse in 18 mega-ohm resistance DI water and performed until the rinse water achieves an equivalently high 18 mega-ohm resistivity endpoint as can be monitored using a conductivity meter in the rinse water path. This or a similar cleaning process to ensure all salts and other ionic contaminates are removed before sealing the components under an ionic blocking layers such as electronics grade silicone is necessary to ensure such contaminants don't interfere with device performance or reliability though changes in conductivity between transmission lines or device corrosion. Additional cleaning steps may be utilized such as plasma cleaning in an argon oxygen plasma, where such plasma cleaning can promote adhesion of the layers being applied by eliminating hydrocarbons and activating the exposed surfaces.

In a preferred embodiment, the device or assembly may be coated in a secondary barrier applied directly on the device, assembly, circuit-board or housing and may consist of a ALD (atomic layer deposition) coating of 20 alterating zirconia and alumina nanolayers of 5 nm each which serves as a secondary protection. This may be followed by layer of Eccostock FFP syntactic foam made by Emerson and Cumming and applied to a thickness of 0.5 to 7 mm depending on the frequency of operation and structures being coated and for example may be 2 mm thick on a 10 GHz circuit containing PWB, MMICs and wirebonds. The foam may be compacted using a vibration table and then baked at 120 C for an hour in air or as necessary to fuse the coatings on the syntactic foam. Next a 0.5 mm thick electronics grade silicone may be applied directly to the syntactic foam and baked. This can be followed by an acid resistant solder mask applied to approximately 25 microns thickness and baked to provide both a layer of protection and adhesion for a subsequent conductive silver paint, also applied by a painting process to approximately 25 microns thickness and which serves as a EMI blocking or shielding layer. The coating is baked to dry and cure it. The EMI shielding layer is prepared in a way to ensure it is in electrical contact with the ground plane of the circuits or device at one or more locations around the perimeter of the syntactic foam. A second adhesion layer (the acid resistant solder mask) is next applied and cured by baking and then a final additional ionic and moisture barrier, such as silicone, is applied at a thickness of 0.5 mm thickness and baked until cured at 120 C for an hour or according to the manufacturer's directions.

In the context of mass transport, permeability is defined as the product of solubility and the coefficient of diffusion. Hence, polymer coatings are known that are hydrophobic and thus impermeable to water but permeable to ionic species. Further, polymer materials are known that are both hydrophobic and ion impermeable. Ionic species comprise cations and anions. Cations include, without limitation, lithium, sodium, potassium, cesium, magnesium, calcium, cupric, cuprous, ferric, and ferrous ions. Anions include, without limitation, the halides such as fluorides, chlorides, bromides and iodides as well as hydroxides, nitrates, sulfates, acetates and the like.

Examples of water impermeable but ion permeable polymer materials include ion porous polytetrafluoroethylene film (PTFE-commonly known as Teflon® or Fluon®, marketed as Tetratex® or Gore Fabric®) as well as water swellable polyurethane or polyurethane/polyol copolymer, for example, Scotch-Seal Chemical Grout 5610, manufactured by 3M Corporation, or a water soluble polyacrylamide Cyanagel 2000, available from CYTEC Technology Corporation. Examples of polymers that are both water impermeable and ion impermeable include, without limitation, Amorphous copolymers of PTFE and perfluoro (2,2-dimethyl-1,3-dioxaole), available from DuPont, polychlorofluoropolymers, available from Aclon, olynorbornenes, polyphenylenes, silicones, and parylenes. Thus, to enable a reliable non-hermetic package using a low-k materials a sealing layer containing both properties of being an ionic barrier and a moisture barrier are important to providing a primary protective coating to the circuits.

Application of these approaches may be used for packaging chips where a microwave capable lead-frame or a package such as a quad-flat-no lead (QFN) package is used. The methods described herein may advantageously be used, instead of using the more expensive and difficult hermetic or semi-hermetic packages, because it is difficult to package a device in such a way that one obtains a hermetic bond between different materials such as plastics and metals that prevents diffusion of gasses or moisture through seals, adhesive layers, and plastics.

Circuit boards used in microwave assemblies may include several features such as recessed topographies on the upper and lower surfaces, embedded passive devices, ground planes, metal cladding and heat spreaders mounted on the board to accommodate heat generating devices, particularly active microwave devices.

It may be desirable to employ heat spreaders to dissipate heat generated by various microwave devices. Heat spreaders comprise thermally conductive materials. Such thermally conductive materials may include, without limitation, silver filled, metal filled, ceramic filled materials or thermally conductive epoxies and thermally reworkable adhesives, such as those available from AIT Technology, Masterbond, or Diemat. For example, Diemat has a thermal conductivity of 17 W/mK in a reworkable thermoplastic/thermoset material 4130HT and has indicated that materials of 25 W/mK are available for sampling as well as 6030H, which has a thermal conductivity of 75 W/mK. This approach allows the use of heat-spreaders having thermal expansion coefficients that are more closely matched to the die, for example Cu/Mo, Cu W, synthetic diamond, and laminates thereof.

Advantages of having a metal clad board may also include enabling the bonding of the board directly to a secondary heat sink, which for high power applications may be passively air cooled, forced air cooled, liquid cooled, or cooled by refrigerant. Such a heat sink may be mechanically clamped or permanently bonded with a thermally conductive adhesive or solder, or cooling channels may be directly created in the metal of the board if it is suitably thick.

Portions of the circuit board upper and lower surfaces may be recessed, for example as illustrated on the top surface in FIG. 1. Such topography may enable a controlled volume of low-k material to be used and for it to be confined on its sides to provide mechanical forming and structural support Further, a recessed topography can reduce profile, or provide a direct thermal path for dissipating heat generated by a device. Notwithstanding the foregoing, mounting on a top surface of a board may also be used, for example, when there is limited heat generated, such as in a diode or low noise amplifier or when fabrication simplicity is desired. Alternatively thermal vias may be used to heat-sink devices mounted on dielectric layers on a boards surface. In such cases where a low-k material is to be used on upper board surface or where a low-k material is used to mold around a device or circuit on one or more surfaces a die or mold may be used to compress or form the low-k material into a desired shape. The material may be deposited and then molded or may be injected into the die or mold at the time the mold or die is placed on or over or around the circuit to be coated.

The methods described herein enable non-hermetic circuitboards to replace hermetic modules. For example, in FIG. 1, a microwave device such as a GaN microwave die may be bonded to a heat-spreader, mounted in a stamped or cut or machined pocket on a microwave circuit board. The use of metal backed boards may further provide a heat sinking function as well as mechanical rigidity and strength. Non-hermetic connectors may be attached to such a board and/or interconnect may be fed under one or more layer to a second recessed periphery area of the board for wirebonding. Board substrates with copper, brass, or aluminum backings are available from, for example, Taconic and Rodgers Corporation. Where minimized weight or cost is desired, one or more metal slugs or thermal vias may be used in a non-metal clad board. Microwave devices may be interconnected on a circuit board using wire-bonds, surface mounting, microwave jumpers or beam-leads in design configurations known to reduce parasitic effects.

According to the instant approaches, substantially all traditional board mounting options are preserved. These include mounting technologies for multi-layer boards, surface mount, and through-hole techniques, where the metal backing is removed or is not present. Such boards may use thin film or laminated sheet resistor or capacitor materials, such as those available from DuPont.

Rework of boards after low-k material and one or more ionic barrier sealing layers is applied can be accomplished by any process that suitably removes coatings. For example, some materials can be removed mechanically while other polymer materials, particularly those that have not been cross-linked, can be removed by solvent dissolution. Certain cross-linked materials may be removed using solvents that swell and delaminate the coating. However, coatings such as densely cross-linked epoxy materials may require an oxygen plasma strip. Moreover, inorganic filled materials may require further stripping with an etch chemistry that attacks the inorganic substance. For example, silica microballoon composites may require a fluorine plasma or an HF wet strip either alone or in conjunction with any of the foregoing. Alternatively a oxygen containing plasma etch may be used to remove the binders from a syntactic foam and the device may be placed in an inverted manner to accelerate removal of glass microballons. Alternatively, brief contact with buffered hydrofluoric acid can be used to remove silica based aerogel. Re-routing of the pocket mechanically may be accomplished to provide a fresh surface of the heat-sink layer. The applicable techniques may be used according to materials in use. In a preferred rework approach, one or more primary barriers may be cut away with a razor and peeled away and the syntactic foam may be oxygen plasma ashed to remove its binder. A secondary protection layer such as an ALD coating may typically be thin enough to allow wirebonding through it and reworkable conductive adhesvies or solders can allow chip or mounted devices to be detached and re-attached. The non-hermetic sealing steps can then be applied a second time.

In addition to reducing production costs, the approach disclosed herein also enables the production of relatively large sheets containing an array of devices to be produced or assembled at one time. These can later be divided into separate devices, or can be used in strips, or 2-D arrays for applications such as phased arrays.

Although the present invention has been shown and described with reference to particular examples, various changes and modifications which are obvious to persons skilled in the art to which the invention pertains are deemed to lie within the spirit, scope and contemplation of the invention.

What is claimed is:

1. A method of forming a microwave assembly, comprising:
   a. providing a microwave circuit comprising at least one microwave transmission line.
   b. forming a dielectric layer having a dielectric constant between about 1.01 and about 2.00 over the circuit;
   c. forming an ionic barrier layer comprising a silicone over the dielectric layer;
   d. forming an electromagnetic interference blocking layer over the ionic barrier layer; and
   e. forming a second ionic barrier layer comprising a silicone over said electromagnetic interference blocking layer.

2. A method of forming a microwave assembly comprising:
   a. providing a microwave circuit comprising at least one microwave transmission line;
   b. forming at least one dielectric layer having a dielectric constant between about 1.01 and about 2.00 over the circuit;
   c. forming a least one electromagnetic interference blocking layer over the at least one dielectric layer; and
   d. forming at least one ionic barrier layer over the at least one electromagnetic interference blocking layer or the at least one dielectric layer.

3. The method according to claim 2, wherein the at least one electromagnetic interference blocking layer comprises a conductive coating, a metal coating, a metallized plastic, a metal lid or combinations thereof.

4. The method claim 3, further comprising removing and replacing at least one of the dielectric layer, the conductive coating or an encapsulating coating.

5. The method according to claim 2, wherein the at least one electromagnetic interference blocking layer is a conductive coating comprising gold, silver, copper, palladium, or platinum.

6. A method of forming a microwave assembly, comprising:
   a. providing a microwave circuit comprising at least one microwave transmission line;
   b. forming at least one dielectric layer having a dielectric constant between about 1.01 and about 2.00 over the microwave circuit; and
   c. forming at least one ionic barrier layer over the at least one dielectric layer.

7. The method according to claim 6, wherein the thickness of the dielectric layer is at least 25 microns.

8. The method according to claim 6, further comprising forming at least one electromagnetic interference blocking layer over the at least one dielectric layer.

9. The method according to claim 6, further comprising forming an electromagnetic interference absorbing layer.

10. The method according to claim 9, wherein the electromagnetic interference absorbing layer comprises at least one of one or more electrically lossy materials, one or more magnetically lossy materials, or a combination thereof.

11. The method according to claim 6, wherein the at least one dielectric layer comprises at least one of a syntactic foam, an expanded foam, an aerogel, or a highly porous material formed from a composite comprising a porogen.

12. The method according to claim 6, wherein the at least one ionic barrier layer comprises at least one of a silicone, a parylene, a polyimide, or a curable BCB resin.

13. The method according to claim 6, wherein the at least one ionic barrier layer comprises an electronics grade silicone.

14. The method according claim 6, further comprising forming a dielectric layer on the microwave circuit by aerosol, atomic layer deposition, or vapor deposition.

15. A non-hermetic package for protecting a microwave assembly comprising:
   a. a microwave circuit comprising at least one microwave transmission line;
   b. at least one dielectric layer having a dielectric constant between about 1.01 and about 2.00 over the microwave circuit;
   c. at least one electromagnetic interference blocking layer over the at least one dielectric layer; and
   d. at least one ionic barrier layer over the at least one electromagnetic interference blocking layer or the at least one dielectric layer.

16. The non-hermetic package of claim 15, wherein the at least one electromagnetic interference blocking layer absorbs microwave radiation.

17. The non-hermetic package of claim 15, wherein the at least one electromagnetic interference blocking layer comprises a conductive coating, a metal coating, a metallized plastic, a metal lid or combinations thereof.

18. The non-hermetic package of claim 15, wherein the at least one electromagnetic interference blocking layer comprises a conductive coating comprising at least one metal chosen from gold, silver, copper, palladium, platinum or combinations thereof.

19. A non-hermetic package for protecting a microwave assembly comprising:
   a. a microwave circuit comprising at least one microwave transmission line;
   b. at least one dielectric layer having a dielectric constant between about 1.01 and about 2.00 over the microwave circuit; and
   c. at least one ionic barrier layer over the at least one dielectric layer.

20. The non-hermetic package of claim 19, wherein the thickness of the dielectric layer is at least 25 microns.

21. The non-hermetic package of claim 19, further comprising at least one electromagnetic interference blocking layer over the at least one dielectric layer.

22. The non-hermetic package of claim 19, further comprising an electromagnetic interference absorbing layer.

23. The non-hermetic package of claim 22, wherein the at least one electromagnetic interference absorbing layer comprises at least one of one or more electrically lossy materials, one or more magnetically lossy materials, or a combination thereof.

24. The non-hermetic package of claim 19, wherein the at least one dielectric layer comprises at least one of a syntactic foam, an expanded foam, an aerogel, or a highly porous material formed from a composite comprising a porogen.

25. The non-hermetic package of claim 19, wherein the at least ionic barrier layer comprises at least one of a silicone, a parylene, a polyimide, or a curable BCB resin.

26. The non-hermetic package of claim 19, wherein the at least one ionic barrier layer comprises an electronics grade silicone.

27. The non-hermetic package for protecting a microwave assembly according claim 19 further comprising forming a dielectric layer on the microwave circuit by aerosol, atomic layer deposition, or vapor deposition.

* * * * *

UNITED STATES PATENT AND TRADEMARK OFFICE
CERTIFICATE OF CORRECTION

PATENT NO. : 8,969,132 B2  
APPLICATION NO. : 13/237931  
DATED : March 3, 2015  
INVENTOR(S) : David W. Sherrer and James MacDonald Page 1 of 1

It is certified that error appears in the above-identified patent and that said Letters Patent is hereby corrected as shown below:

The Title Page of the Patent should read:

item --(60) Related U.S. Application Data  
Provisional application No. 61/384,374, filed on Sep. 20, 2010, provisional application No. 61/421,854, filed on Dec. 10, 2010, provisional application No. 61/521,742, filed on Aug. 9, 2011.--

Signed and Sealed this  
Second Day of June, 2015

Michelle K. Lee  
*Director of the United States Patent and Trademark Office*